(12) United States Patent
Peng et al.

(10) Patent No.: US 8,378,283 B1
(45) Date of Patent: Feb. 19, 2013

(54) PHOTOELECTRIC SWITCH CONTROL CIRCUIT

(75) Inventors: Xiao-Zhan Peng, Shenzhen (CN); Hsing-Suang Kao, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/525,378

(22) Filed: Jun. 18, 2012

(30) Foreign Application Priority Data

Apr. 28, 2012 (CN) .......................... 2012 1 0132156

(51) Int. Cl.
*H01J 40/14* (2006.01)
(52) U.S. Cl. ........................ 250/205; 250/229
(58) Field of Classification Search ................... 250/205
See application file for complete search history.

(56) References Cited

U.S. PATENT DOCUMENTS

| 4,395,100 A * | 7/1983 | Kondo | 396/159 |
| 5,026,978 A * | 6/1991 | Misumi et al. | 250/205 |
| 6,891,142 B2 * | 5/2005 | Ogawa | 250/205 |

* cited by examiner

*Primary Examiner* — Van Chow
(74) *Attorney, Agent, or Firm* — Altis Law Group, Inc.

(57) ABSTRACT

A photoelectric switch control circuit includes a first resistance; a first capacitance; and a photoelectric switch having a plurality of contacts which comprise a first to a fourth contacts. The first contact is grounded, one end of the first resistance, the second and the third contacts of the photoelectric switch and one end of the first capacitance connects at node A, the fourth contact is connected with the processing unit and grounded via a second resistance, the other end of the first resistance is connected with a voltage source, the other end of the first capacitance is grounded.

5 Claims, 2 Drawing Sheets

PHOTOELECTRIC SWITCH CONTROL CIRCUIT

BACKGROUND

1. Technical Field

The present disclosure relates to photoelectric switch control circuits, and more particularly to an photoelectric switch control circuit which decreases operation errors.

2. Description of Related Art

FIG. 1 is a schematic circuit diagram of a conventional photoelectric switch control circuit. The photoelectric switch control circuit 10 is connected to a processing circuit 20, to generate logic low (level) or logic high (level) to the processing circuit 20.

The processing circuit 20 performs functions corresponding to the logic low or logic high. The photoelectric switch control circuit 10 includes a first resistance 100, a photoelectric switch 200 and a first capacitance 300. The photoelectric switch 200 having a plurality of contacts which comprise a first to a fourth contacts. The first and the fourth contacts are grounded. One end of the first resistance 100, the second and the third contacts of the photoelectric switch 200 and one end of the first capacitance 300 connects at node A. A voltage of the node A is sent to the processing unit 20 to control the processing circuit 20 to perform functions. The other end of the first resistance 100 is connected with a voltage source Vcc. The other end of the first capacitance 300 is grounded. After the voltage source Vcc is connected, a plurality of light emitting devices connected between the first and the second contacts emit infrared light, a plurality of light detecting devices connected between the third and the fourth contacts detect the infrared light. The third and the fourth contacts are connected together when the infrared light is detected, thereby node A is grounded to generate the logic low to the processing circuit 20. The third and the fourth contacts are disconnected when the infrared light is not detected, thereby node A is connected to the voltage source Vcc to generate the logic high to the processing circuit 20. The first resistance 100 is used to adjust power between the first and the second contacts of the photoelectric switch 200. The first capacitance 300 is used to filter the voltage source Vcc to enable a stable voltage between the first and the second contacts of the photoelectric switch 200.

However, a barrier voltage of a PN junction diode exists between the third and the fourth contacts of the photoelectric switch control circuit 10, even if the third and the fourth contacts are connected together. The node A is easily to be recognized to generate the logic high when the third and the fourth contacts are connected together, which makes the processing unit performs the wrong functions.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments.

DETAILED DESCRIPTION

Embodiments of the present disclosure will be described below, with reference to the accompanying drawings.

Figure 1:
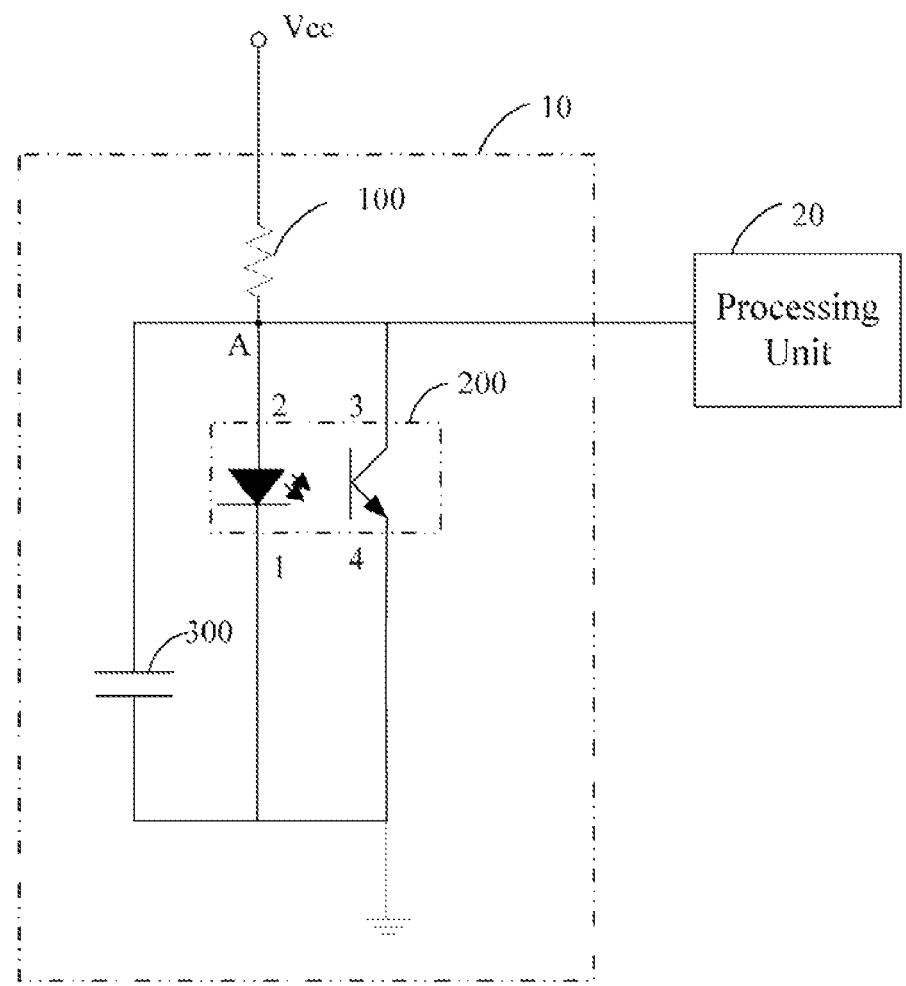
FIG. 1 is a schematic circuit diagram of a conventional photoelectric switch control circuit.
Figure 2:
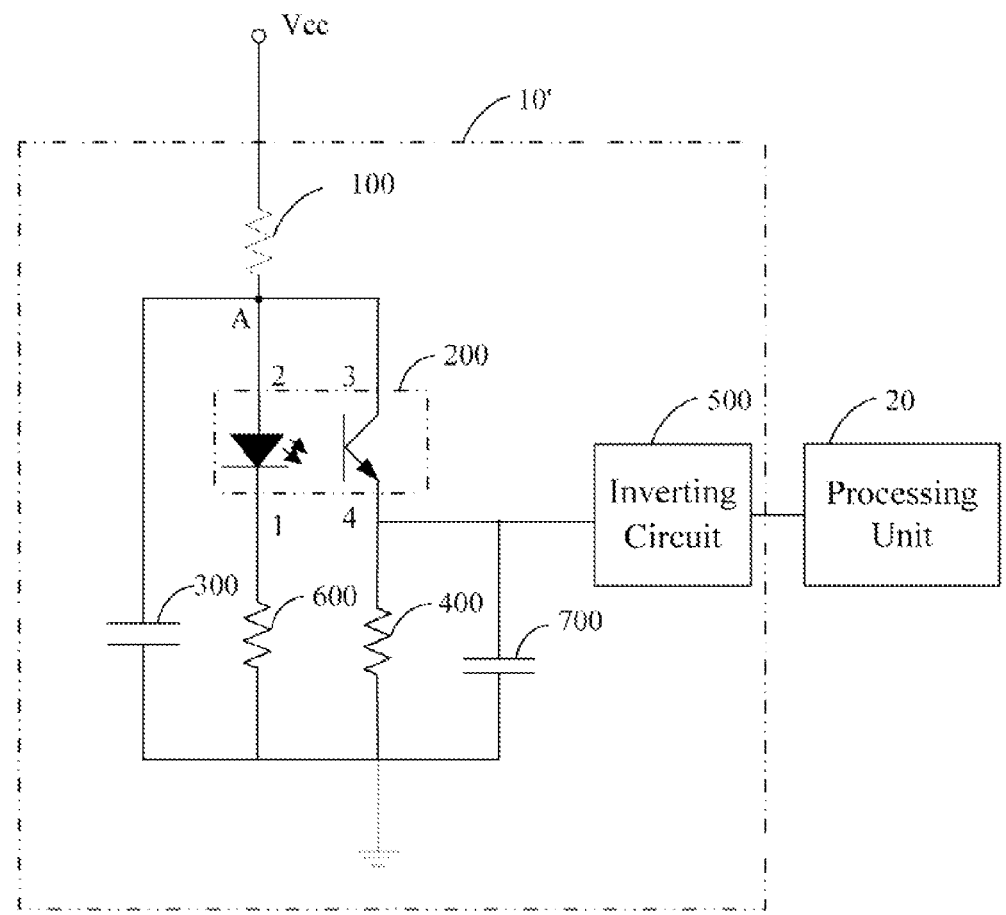
FIG. 2 is a schematic circuit diagram of one embodiment of a photoelectric switch control circuit in accordance with the present disclosure.

FIG. 2 is a schematic circuit diagram of one embodiment of a photoelectric switch control circuit 10' in accordance with the present disclosure. The photoelectric switch control circuit 10' is applied in detecting whether discs is inserted in a portable DVD or in DVD pickup head circuit. Compared with FIG. 1, the fourth contact of the photoelectric switch 200 in present disclosure is connected with the processing unit 20, and is grounded via a second resistance 400. After the voltage source Vcc is connected, the light emitting devices connected between the first and the second contacts emit infrared light, the light detecting devices connected between the third and the fourth contacts detect the infrared light. The third and the fourth contacts are connected together when the infrared light is detected, as the existing of the first resistance 100 and the second resistance 400, the fourth contact generates the logic high. The third and the fourth contacts are disconnected when the infrared light is not detected, the fourth contact is thereby grounded to generate the logic low. In such way, even if the barrier voltage of the PN junction diode exists between the third and the fourth contacts, the voltage of the fourth contact has nothing to do with the barrier voltage, the processing unit 20 will not perform the wrong functions thereby decreasing operation errors.

In an embodiment, many systems to which the processing unit 20 are applied require the logic low when the infrared light is detected and logic high when the infrared light is not detected. For this reason, the photoelectric switch control circuit 10' additionally includes an inverting circuit 500 connected between the fourth contact of the photoelectric switch 200 and the processing unit 20 to inverse the voltage of the fourth contact of the photoelectric switch 200, and output an inversed logic low/high to the processing unit 20.

In an embodiment, the first resistor 100 has a fixed resistance value to ensure the fourth contact to generate stable logic high when the infrared light is detected. Thus, the photoelectric switch control circuit 10' further includes a third resistance 600 connected between the first contact of the photoelectric switch 200 and ground to adjust the power between the first and the second contacts of the photoelectric switch 200.

In an embodiment, the photoelectric switch control circuit 10' further includes a second capacitance 700 connected between the fourth contact of the photoelectric switch 200 and ground to filter the voltage of the fourth contact of the photoelectric switch 200, thereby obtaining stable logic high.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A photoelectric switch control circuit for being connected with a processing circuit which performs functions corresponding to a logic low (level) or logic high generated by the photoelectric switch control circuit, the photoelectric switch control circuit comprising:
    a first resistance;
    a first capacitance; and
    a photoelectric switch having a plurality of contacts which comprise a first to a fourth contacts;
    a plurality of light emitting devices, connected between the first contact and the second contact to emit infrared light;
    a plurality of light detecting devices, connected between the third contact and the fourth contact to detect the infrared light;

wherein the first contact is grounded, one end of the first resistance, the second and the third contacts of the photoelectric switch and one end of the first capacitance connect at a node A; the fourth contact is to be connected with the processing unit, and grounded via a second resistance, the other end of the first resistance is to be connected with a voltage source, the other end of the first capacitance is grounded, and wherein after the voltage source is connected to the first resistance and the fourth contact connected with the processing unit, the third contact and the fourth contact are connected together when the infrared light is detected as the existing of the first resistance and the second resistance, thereby the fourth contact generates the logic high, the third and the fourth contacts are disconnected when the infrared light is not detected, the fourth contact is thereby grounded to generate the logic low.

2. The photoelectric switch control circuit of claim 1, further comprising an inverting circuit connected between the fourth contact of the photoelectric switch and the processing unit to inverse a voltage of the fourth contact of the photoelectric switch, and output an inversed logic low/high to the processing unit.

3. The photoelectric switch control circuit of claim 1, wherein the first resistor has a fixed resistance value to ensure the fourth contact of the photoelectric switch to generate stable low high when the infrared light is detected, the photoelectric switch control circuit further comprises a third resistance connected between the first contact of the photoelectric switch and ground to adjust power between the first and the second contacts of the photoelectric switch.

4. The photoelectric switch control circuit of claim 1, further comprising a second capacitance connected between the fourth contact of the photoelectric switch and ground to filter a voltage of the fourth contact of the photoelectric switch, thereby obtaining stable logic high.

5. The photoelectric switch control circuit of claim 1, wherein the photoelectric switch control circuit is applied in detecting whether discs is inserted in a contactable DVD or in DVD pickup head circuit.

* * * * *